(12) United States Patent
Kawamura

(10) Patent No.: US 6,288,944 B1
(45) Date of Patent: Sep. 11, 2001

(54) NAND TYPE NONVOLATILE MEMORY WITH IMPROVED ERASE-VERIFY OPERATIONS

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/577,373

(22) Filed: May 23, 2000

(30) Foreign Application Priority Data

Aug. 16, 1999 (JP) .................................................. 11-230073

(51) Int. Cl.[7] .................................................. G11C 16/06

(52) U.S. Cl. ................................ 365/185.22; 365/185.21; 365/185.29

(58) Field of Search ........................ 365/185.22, 185.21, 365/185.29, 185.01

(56) References Cited

U.S. PATENT DOCUMENTS

| 6,028,794 | * | 2/2000 | Nakai et al. | 365/185.29 |
| 6,031,760 | * | 2/2000 | Sakui et al. | 365/185.21 |
| 6,049,494 | * | 4/2000 | Sakui et al. | 365/203 |
| 6,055,188 | * | 4/2000 | Takeuchi et al. | 365/185.22 |

FOREIGN PATENT DOCUMENTS 7-192482  7/1995 (JP).

* cited by examiner

Primary Examiner—Hoai V. Ho
(74) Attorney, Agent, or Firm—Arent Fox Kintner Plotkin & Kahn, PLLC

(57) ABSTRACT

The invention provides a NAND type nonvolatile memory comprising: a sense circuit 100 having a constant current supply source P7 connected to a bit line to which memory cells are connected and a sense transistor N8 for sensing potential at the connection point thereof; a first reference potential ARVss on the opposite side from the bit line of the memory cells; and a second reference potential PBVss to which the source of the sense transistor is connected, wherein during Erase-verify operations the first reference potential ARVss and the second reference potential PBVss are controlled to predetermined positive potential. By controlling the first reference potential ARVss to positive potential, the control gate level of a memory cell can be equivalently brought to Erase-verify level (which is negative), and by further controlling the second reference potential PBVss of the sense transistor N8 to positive potential as well, the equivalent threshold voltage of the sense transistor N8 can be increased, or the equivalent trip level of the sense inverter increased, thereby solving the conventional problems associated with Erase-verify operations.

8 Claims, 13 Drawing Sheets

FIG. 3A  Read
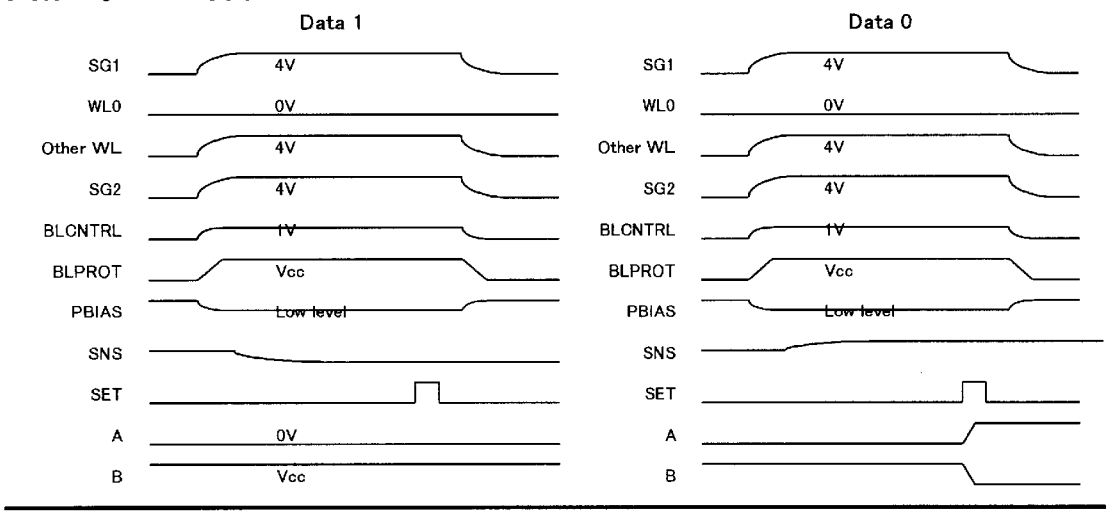
FIG. 3B  Write Verify
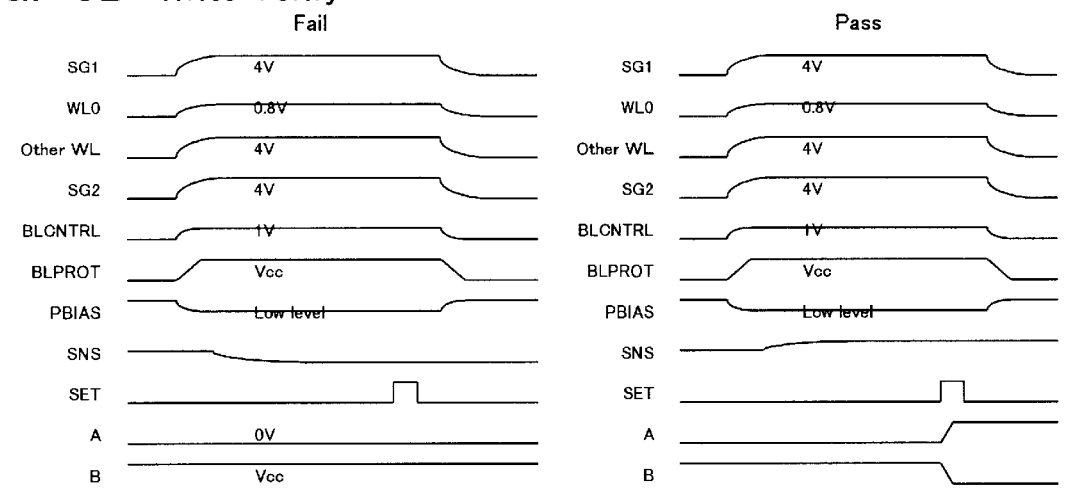
FIG. 3C  Erase Verify
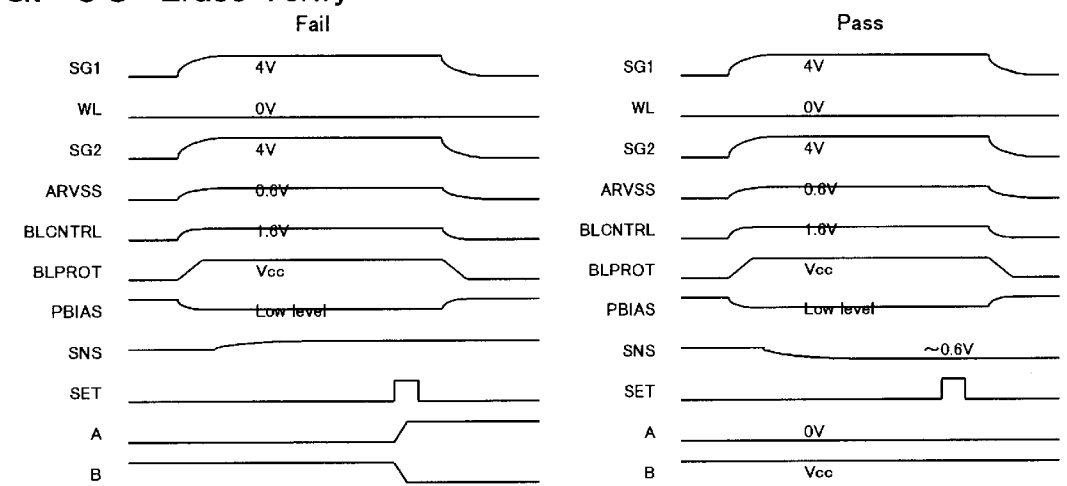

FIG. 4A

|  | SG1 | Selected WL | Unselected WL | SG2 | BL | ARVSS | PBVSS |
|---|---|---|---|---|---|---|---|
| Read | 4v | 0v | 4v | 4v | 1v | 0v | 0V |
| Program Verify | 4v | 0.8v | 4v | 4v | 1v | 0v | 0V |
| Erase Verify | 4v | 0v | 0v | 4v | 1.6v | VVER | VVER |

VVER:reference level for erase verify

FIG. 4B

|  | SG1 | Selected WL | Unselected WL | SG2 | BL | ARVSS | PBVSS |
|---|---|---|---|---|---|---|---|
| Read | 4v | 0v | 4v | 4v | 1v | 0v | 0V |
| Program Verify | 4v | 0.8v | 4v | 4v | 1v | 0v | 0V |
| Erase Verify | 4v | 0v | 0v | 4v | 1.6v | VVER1 | VVER2 |

VVER1:reference level for erase verify
VVER2:reference level for erase verify

FIG. 7A
Read
FIG. 7B
Write Verify
FIG. 7C
Erase Verify
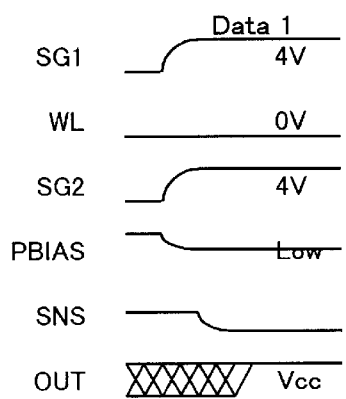
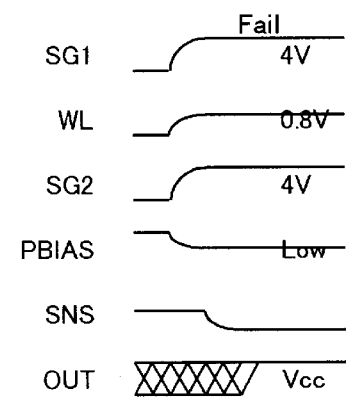
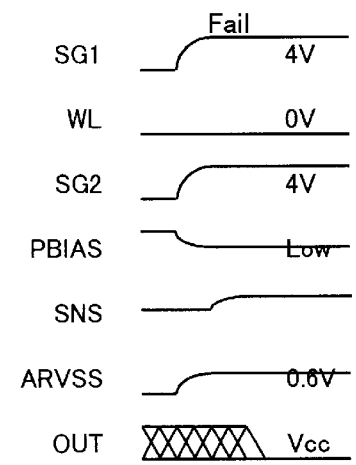
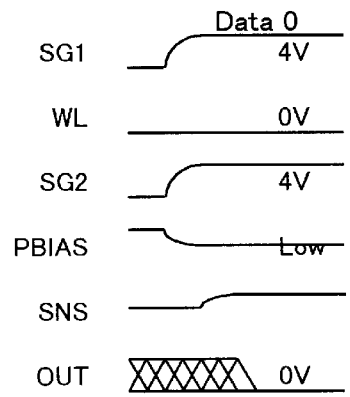
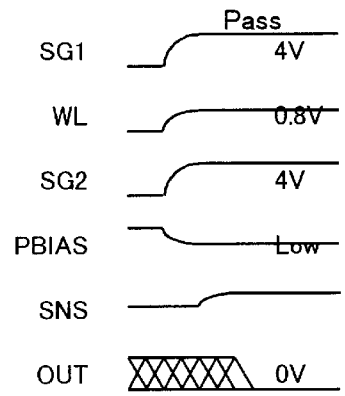
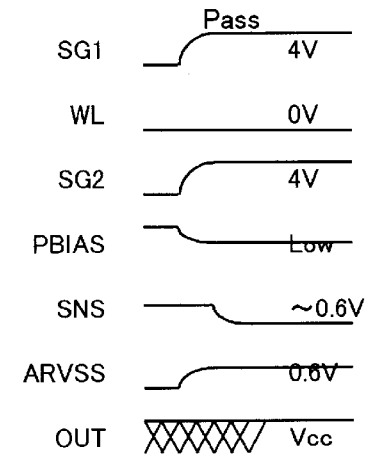

FIG. 8A Voltage Condition 1

|  | PBIAS | SG1 | WL | SG2 | ARVSS | PBVSS | ERVB |
|---|---|---|---|---|---|---|---|
| Read | Low | 4V | 0V | 4V | 0V | 0V | Vcc |
| Program Verify | Low | 4V | 0.8V | 4V | 0V | 0V | Vcc |
| Erase Verify | Low | 4V | 0V | 4V | VVER | VVER | 0V |

VVER:reference level for erase verify

PBVSS = ARVSS

FIG. 9A  Voltage Condition 2

|  | PBIAS | SG1 | WL | SG2 | ARVSS | PBVSS | ERVB |
|---|---|---|---|---|---|---|---|
| Read | Low | 4V | 0V | 4V | 0V | 0V | Vcc |
| Program Verify | Low | 4V | 0.8V | 4V | 0V | 0V | Vcc |
| Erase Verify | Low | 4V | 0V | 4V | VVER1 | VVER2 | 0V |

VVER1:reference level for erase verify
VVER2:reference level for erase verify

PBVSS
PBVSS ≠ ARVSS

|  | PBIAS | SG1 | WL | SG2 | ARVSS | PBVSS | BLCNTRL |
|---|---|---|---|---|---|---|---|
| Read | Low | 4V | 0V | 4V | 0V | 0V | 1V |
| Program Verify | Low | 4V | 0.8V | 4V | 0V | 0V | 1V |
| Erase Verify | Low | 4V | 0V | 4V | VVER | VVER | High level |

VVER:reference level for erase verify

|  | PBIAS | SG1 | WL | SG2 | ARVSS | PBVSS | ERVB |
|---|---|---|---|---|---|---|---|
| Read | Low | 4V | 0V | 4V | 0V | 0V | 1V |
| Program Verify | Low | 4V | 0.8V | 4V | 0V | 0V | 1V |
| Erase Verify | Low | 4V | 0V | 4V | VVER1 | VVER2 | High level |

VVER1:reference level for erase verify
VVER2:reference level for erase verify

|  | PBIAS | SG1 | WL | SG2 | ARVSS | ERVB |
|---|---|---|---|---|---|---|
| READ | LOW | 4V | 0V | 4V | 0V | Vcc |
| PROGRAM VERIFY | LOW | 4V | 0.8V | 4V | 0V | Vcc |
| ERASE VERIFY | LOW | 4V | 0V | 4V | 0.6V | 0V |

NAND TYPE NONVOLATILE MEMORY WITH IMPROVED ERASE-VERIFY OPERATIONS

BACKGROUND OF THE INVENTION

1. Field of the Invention

The present invention relates to a NAND type nonvolatile memory, and more particularly to a NAND type nonvolatile memory enabling Erase-verify operations while ensuring a larger erase margin.

2. Description of the Related Art

In flash memory and other types of nonvolatile memory having NAND type memory cell structure, FN tunneling (Fowler/Nordheim tunneling)is utilized for injecting electrons into a floating gate in order to program and for draining electrons in order to erase. Energy consumption is therefore lower than with NOR type flash memory. A plurality of memory cell transistors are connected in series in a cell string connected to a bit line, and during a Read operation a Read voltage is applied to the gate of a selected cell transistor, with high voltage being applied to the remaining cell transistors to render them all conducting. Accordingly, as the current flowing through the cell string is relatively low, the power consumed during a Read operation is also low. As there limits to the number of cell transistors that can be provided in a cell string, sector size is smaller than with NOR type nonvolatile memory and the erase unit is smaller size. NAND type nonvolatile memory having the characteristics described hereinabove has enjoyed widespread use in recent years.

FIG. 12 is a sectional view of a memory cell transistor in a typical NAND type flash memory. In FIG. 12 (a) shows the erased state and (b) shows the programmed state. Cell transistor structure comprises a source region S and a drain region D formed on a semiconductor substrate surface, a tunnel oxide film OX formed therebetween, a floating gate FG, and a control gate CG. In the erased state (a) shown in FIG. 12, electrons have been drained from floating gate FG; cell transistor threshold voltage Vt is negative so the function thereof is one of a depletion mode transistor. In the programmed state (b) shown in FIG. 12, on the other hand, electrons have been injected into floating gate FG, and cell transistor threshold voltage Vt is positive so the function thereof is one of an enhancement mode transistor.

FIG. 13 is a figure showing a cell string and a page buffer circuit of a NAND type flash memory. Cell string CS is connected to a bit line BL via a select transistor NSG1 and has serially connected memory cells MC0–MCn. To the opposite side of cell string CS is provided a select transistor NSG2 for connection to an array Vss potential ARVss.

Bit line BL is connected via transistors N10, N11 to sense buffer 100. Sense buffer 100 senses the state of memory cell threshold voltage during Read, Program-verify, and Erase-verify operations, and has a latching function. In the figure, N is an n-channel transistor, and P is a p-channel transistor. Sense buffer 100 has a latching circuit 10.

Transistor N1 is a page buffer select transistor connected to output terminal PBOUT. Transistors P2, P3, N4, N5, and N6 are output CMOS circuits. Transistor P7 is a constant current supply source.

For a Read operation, the word line WL of the selected memory cell is driven to about 0 V while the other word lines WL are driven to about 4 V, whereby the selected memory cell turns on or off depending on the state of the threshold voltage, while all of the unselected cells turn on. Depending on whether the selected memory cell is on or off, node SNS goes to H level or to L level; this state is read via conduction or non-conduction by a sense transistor N8 when a Read pulse is applied to a signal SET for conducting the transistor N9, and is latched by latching circuit 10.

Program-verify and Erase-verify operations are carried out analogously to Read operations. For a Program-verify operation, however, instead of driving the word line of the selected memory cell to 0 V, a positive voltage corresponding to Program-verify level, for example 0.8 V, is applied. For an Erase-verify operation, the word line of the selected memory cell is driven to negative voltage corresponding to Erase-verify level instead of to 0 V. However, as it is impractical in semiconductor devices to generate negative voltage, typical practice is to drive the word line of the selected memory to 0 V and the array Vss potential ARVss to positive voltage, for example 0.6 V, so that the word line potential of the selected memory cell becomes negative equivalently.

FIG. 14A shows a redundant data storage circuit used in a NAND type flash memory. With this circuit, a redundant memory cell RMC for storing a redundant address is interposed between select transistors RSG1, RSG2 and connected to a sense amp 101. The threshold voltage state of redundant memory cell RMC is read to node SNS by transistors P21, N20 and a NAND gate 12 in sense amp 101, and the state of node SNS is sensed by a CMOS inverter comprising transistors P22, N23. As with ordinary memory cells, the redundant memory cell RMC has negative threshold voltage during erase operations and positive threshold voltage during programming operations.

For a Read operation, the word line WL of redundant memory cell RMC is driven to 0 V whereby it turns on or off depending upon the state of the threshold voltage, and the information therein is read to node SNS. During Program-verify operations, the word line WL of redundant memory cell RMC is driven to a positive voltage corresponding to Program-verify level, and information of whether threshold voltage exceeds the Program-verify level is read to node SNS and sensed by the CMOS inverter. During Erase-verify, the word line WL of redundant memory cell RMC is driven to 0 V, the array Vss voltage ARVss is driven to positive voltage, and word line WL is driven to negative voltage equivalently. Examples of voltages for each operation are given in FIG. 14B.

As described hereinabove, NAND type flash memory has a different structure than NOR type flash memory, in which memory cell threshold voltage is positive during programming operations and negative during erase operations. Thus, with NAND type memory, the practice is to control the array Vss voltage ARVss to positive voltage in order to verify that memory cell or redundant cell threshold voltage Vt is negative during Erase-verify operations.

However, the page buffer circuit 100 in FIG. 13 and the circuit design of the sense amp 101 of FIG. 14 have problems pertaining to Erase-verify operations.

With the constitution of page buffer 100 of FIG. 13, at the erase verify operation, with 0 V applied to word line WL0 for the selected memory cell MC0 and with 4 V applied to the other word lines and to select lines SG1, SG2, transistors N10, N11 are rendered conducting. If the threshold voltage of selected memory cell MC0 is sufficiently negative, selected memory cell MC0 becomes conducting and the voltage on node SNS is pulled down, this voltage being sensed by transistor N8 and latched by latching circuit 10.

However, threshold voltage for transistor N8 is typically on the order of 0.8V, depending on the production process.

Thus, by conduction by selected memory cell MC0, node SNS must be driven lower than the threshold voltage of transistor N8. In such instances, where, from a reliability standpoint, it is necessary to ensure a larger erase margin with respect to Read operations, array Vss voltage ARVss is increased to about 1 V for example, and gate voltage for selected memory cell MC0 equivalently becomes −1 V. By so doing, in case where the selected memory cell MC0 becomes the negative threshold voltage Vt due to sufficient electron drain from the floating gate during erase operations so that even in the conducting state, the potential on node SNS drops at most to array Vss voltage ARVss (=1 V); at this node potential, transistor N8, whose source is connected to ground potential Vss, cannot be rendered non-conducting, and ultimately the Erase-verify operation cannot be performed. That is, whereas a successful Erase-verify operation requires non-conduction of the sense transistor N8 to not invert the state of latching circuit 10, sense transistor N8 cannot be rendered non-conducting even in an erased state.

The same problem relating to Erase-verify also exists in the case of the redundant data storage circuit of FIG. 14A as well. Like the page buffer circuit 100 of FIG. 13, the sense amp 101 of FIG. 14 has a redundant memory cell RMC connected via select transistor RSG1 and transistor N20 with a p-channel transistor P21 serving as a constant current supply source, and node SNS assumes H level or L level depending on whether redundant memory cell RMC is conducting or non-conducting, with the potential on node SNS being sensed by the CMOS inverter having a sense transistor N23 with the source thereof connected to ground Vss.

In this case as well, since it is necessary to ensure a larger erase margin with respect to Read operations, the array Vss voltage ARVss is increased to about 1 V for example, and gate voltage for redundant memory cell RMC equivalently becomes −1 V at the erase verify operation. By so doing, redundant memory cell RMC becomes the negative threshold voltage Vt due to sufficient electron drain from the floating gate so that even in the conducting state, potential on node SNS drops at most to array Vss voltage ARVss (=1 V). This node SNS potential is higher than the trip level of the CMOS inverter P22, N23, and transistor N23, whose source is connected to ground potential Vss, cannot be rendered non-conducting, so that ultimately the Erase-verify operation cannot be performed.

From the preceding it will be apparent that in circuits wherein a node level between a memory cell and a constant current is presented to the gate of a sense transistor having a grounded source, and verify operations are performed via conduction of this sense transistor, Erase-verify operations thereof will be impaired.

SUMMARY OF THE INVENTION

It is an object of the invention to provide a NAND type nonvolatile memory capable of performing Erase-verify operations normally.

It is a further object of the invention to provide, in a nonvolatile memory wherein programming operations result in positive threshold voltage of cell transistors and erase operations result in negative threshold voltage, a nonvolatile memory capable of performing Erase-verify operations normally.

To achieve the stated objects, the invention in a one aspect thereof provides a NAND type nonvolatile memory comprising: a sense circuit having a constant current supply source connected to a bit line to which memory cells are connected and a sense transistor for sensing potential at the connection point thereof; a first reference potential on the opposite side from the bit line of the memory cells; and a second reference potential to which the source of the sense transistor is connected, wherein during Erase-verify operations the first reference potential and the second reference potential are controlled to predetermined positive potential. By controlling the first reference potential to positive potential, the control gate level of a memory cell can be equivalently brought to Erase-verify level (which is negative), and by further controlling the second reference potential of the sense transistor to positive potential as well, the equivalent threshold voltage of the sense transistor can be increased, or the equivalent trip level of the sense inverter increased, thereby solving the conventional problems associated with Erase-verify operations.

To achieve the stated objects, the invention in a first aspect thereof provides a NAND type nonvolatile memory, having cell strings of a plurality of memory cells connected in series in a memory array, comprising: a sense circuit having a constant current circuit connected to a bit line connected to the memory cells and a sense transistor for sensing potential at the connection point thereof; a first reference potential on the opposite side from the constant current circuit of the memory cells; and a second reference potential connected to the source of the sense transistor, wherein during Erase-verify operations, the first reference potential and the second reference potential are controlled to predetermined positive potential.

To achieve the stated objects, the invention in second aspect thereof provides a NAND type nonvolatile memory, having cell strings of a plurality of memory cells connected in series in a memory array, comprising: an auxiliary memory cell for storing redundant information or predetermined information; a redundant sense circuit having a constant current circuit connected to the auxiliary memory cell and a sense transistor for sensing potential at the connection point thereof; a first reference potential on the opposite side from the constant current circuit of the auxiliary memory cell; and a second reference potential for the sense transistor, wherein during Erase-verify operations the first reference potential and the second reference potential are controlled to predetermined positive potential.

BRIEF DESCRIPTION OF THE DRAWINGS

FIGS. 3A, 3B, 3C is a timing chart for operation of the circuit of FIG. 2 during Read, Program (Write)-verify, and Erase-verify operations;

FIGS. 4A, 4B is a chart showing voltage conditions of the circuit of FIG. 2;

FIGS. 7A, 7B, 7C is a timing chart of redundant memory cell operation;

FIGS. 8A, 8B is a figure showing Example 1 of the redundant memory cell;

FIGS. 9A, 9B is a figure showing Example 2 of the redundant memory cell;

DESCRIPTION OF THE PREFERRED EMBODIMENT

An embodiment of the invention is described hereinbelow with reference to the figures. It should be noted, however, that the embodiment is not presented by way of limitation of the technical scope of the invention.

Figure 1:
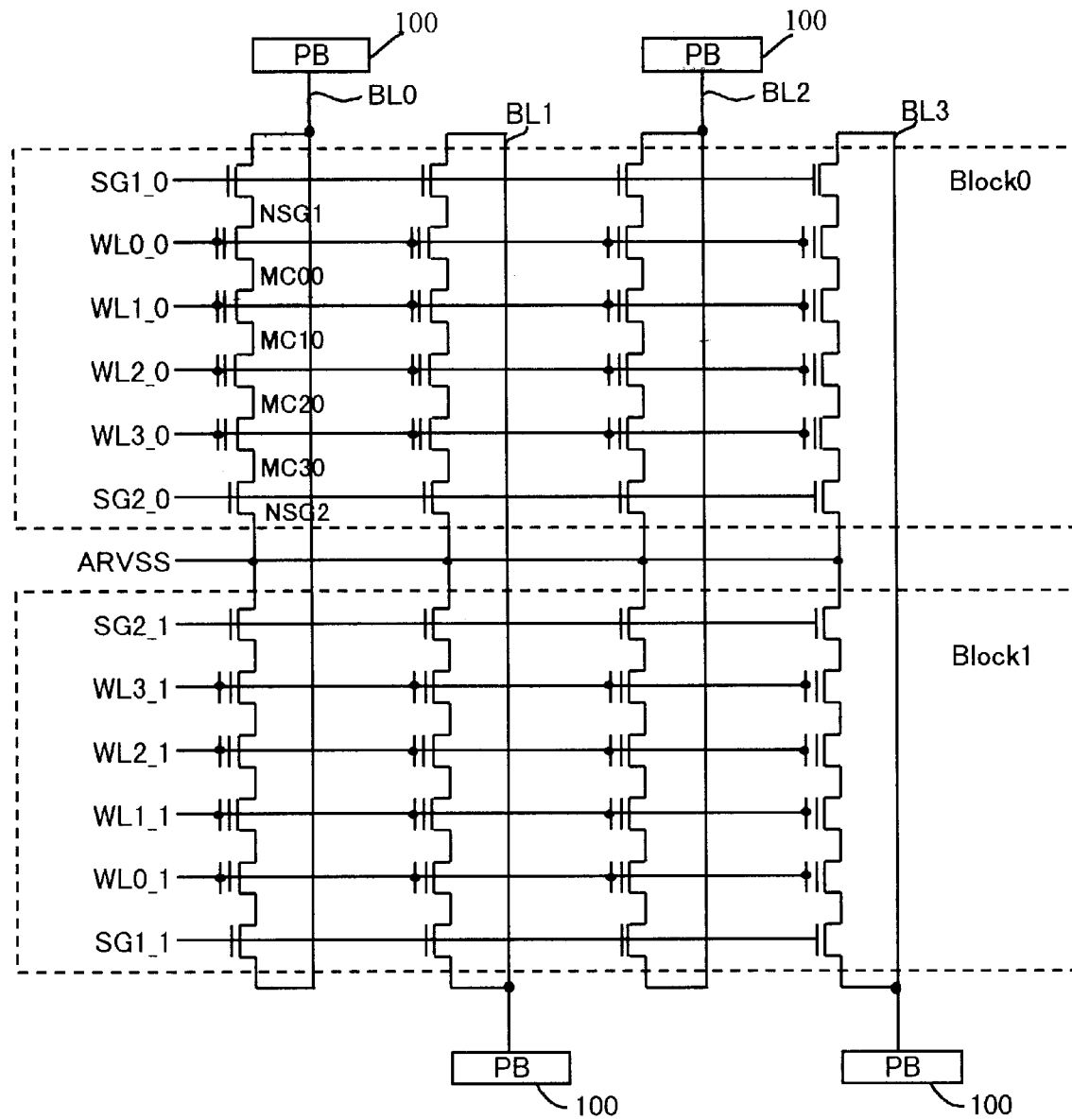
FIG. 1 is a figure showing 8×4 NAND type flash memory array and buffer construction in the present embodiment.

FIG. 1 is a figure showing 8×4 NAND type flash memory array and buffer construction in the present embodiment. In FIG. 1, two blocks Block 0, 1 each having a 4×4 memory array are shown. In NAND type flash memory, a plurality (four in FIG. 1) of memory cells MC00–MC30 connected in series, and select gate transistors NSG1, NSG2 connected in series to the top and bottom thereof form a basic unit termed a single string. A multitude of these strings (two strings in FIG. 1) are connected to a bit line BL0. A page buffer 100 is connected to each of the bit lines BL0–BL3.

As noted, there are typically two states for the memory cells of a NAND type flash memory. In one state, electrons are injected into the floating gate of a memory cell, which stores a logical "0." At this time memory cell threshold voltage Vt is positive and the memory cell functions as an enhancement mode transistor. In the other state, electrons are drained from the floating gate of the memory cell, which stores a logical "1." At this time memory cell threshold voltage Vt is negative and the memory cell functions as an depletion mode transistor.

Figure 2:
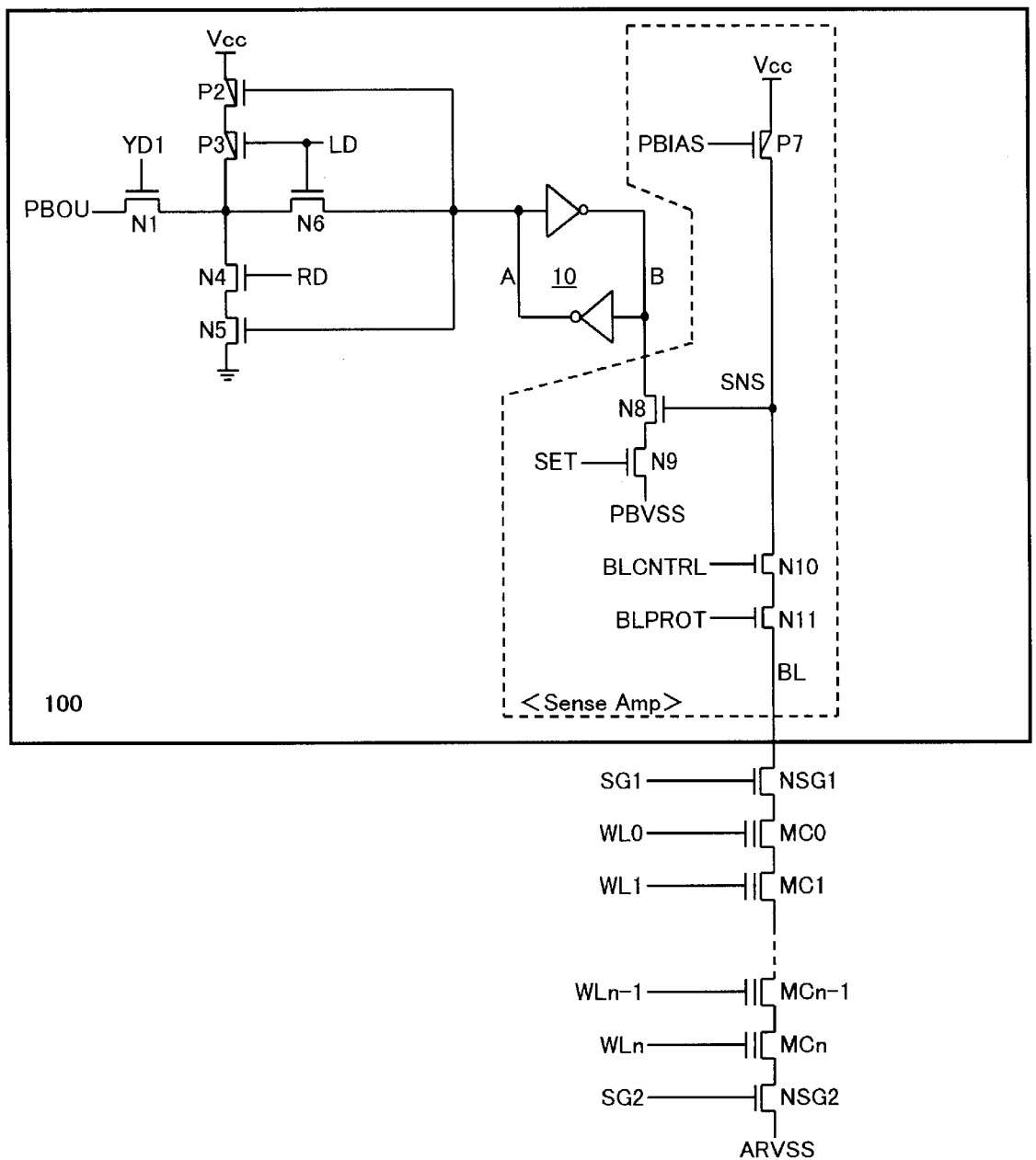
FIG. 2 is a figure showing a page buffer circuit in the present embodiment.
Figure 13:
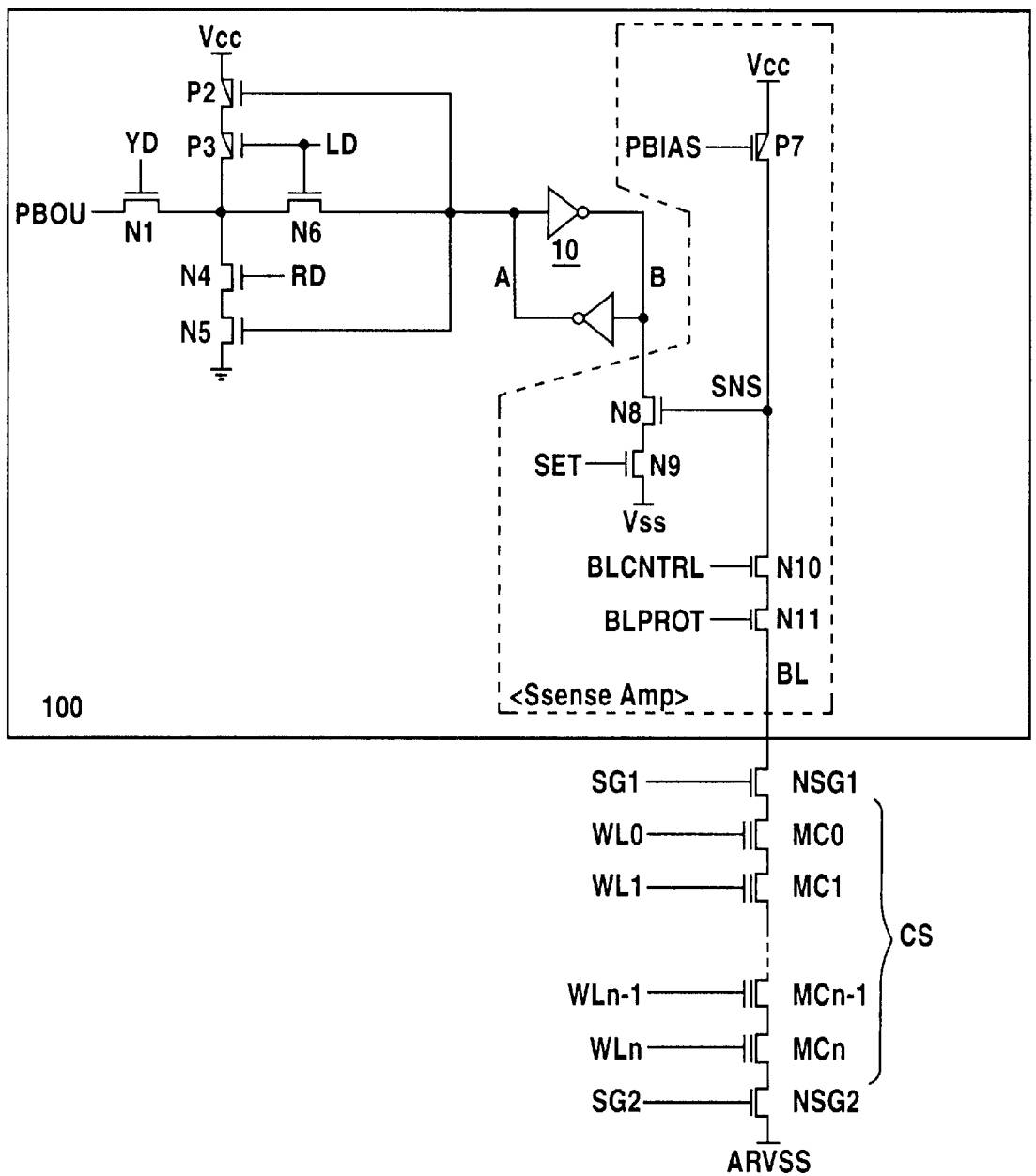
FIG. 13 is a figure showing cell strings and page buffer circuit in a NAND type flash memory.

FIG. 2 is a figure showing a page buffer circuit in the present embodiment. The page buffer circuit 100 of FIG. 2 has a similar design to the conventional page buffer circuit shown in FIG. 13, but while in the conventional example the source terminal (second reference potential) of set transistor N9 of latching circuit 10 is connected to ground potential, in the present embodiment, it is connected to a page buffer Vss potential PBVss. Like the array Vss potential ARVss (first reference potential), this page buffer Vss potential PBVss is held at predetermined positive potential during Erase-verify operations, and is held at potential lower than Erase-verify potential or at ground potential during Read operations and Program-verify operations.

FIG. 3 is a timing chart for operation of the circuit of FIG. 2 during Read, Program (write)-verify, and Erase-verify operations. FIG. 4 is a chart showing example voltages at each node during the above three operations. Read, Program (write)-verify, and Erase-verify operations in the present embodiment are described below making reference to these figures.

Read operation

The Read operation in a NAND type flash memory, shown in FIG. 3A, is as follows. During a Read operation, the array Vss potential ARVss is held at 0 V and the page buffer Vss potential PBVss is also held at 0 V. Let it be assumed that memory cell MC0 connected to word line WL0 has been selected. Let it further be assumed that nodes A and B of latching circuit 10 in page buffer 100 have been preset to L level and H level respectively. Set signal SET is L level.

At this point, 0 V is applied to word line WL0 and about 4 V is applied to the other word lines WL1-n. About 4 V is applied to select gate lines SG1 and SG2 as well, whereby select gate transistors NSG1 and NSG2 are both placed in the conducting state, and the string in which the selected memory cell MC0 resides is selected. By this process, one end of the strings is connected to bit line BL while the other end is connected to the array Vss potential ARVSS (first reference potential). During a Read operation, the array Vss potential ARVSS is 0 V. Of the memory cells in the selected string, memory cells MC1-n other than the selected memory cell MC0 are all in the conducting state regardless of data stored therein.

In this state, with signals BLCNTRL and BLPROT in page buffer 10 at H level (high level), page buffer 100 is connected to bit line BL. Simultaneously, with signal PBIAS at L level, p-type transistor P7 turns on and current is delivered to bit line BL. This current is the basis for determining whether memory cell MC0 contains a logical "1" or a logical "0." More precisely, signal BLCNTRL is controlled to 1 V and signal BLPROT to power supply Vcc, respectively.

As shown in the left column in FIG. 3A, where memory cell MC0 contains a logical "1" the threshold voltage Vt thereof is negative, so although 0 V is applied to word line WL0, memory cell MC0 is nevertheless on and current flows therethrough so that node SNS in the page buffer is pulled towards L level. When an H level pulse is then provided to the set signal SET, set transistor N9 assumes the conducting state and the source terminal of sense transistor N8 is driven to the page buffer Vss potential PBVss (0 V during a Read operation), with node SNS being sensed by sense transistor N8. Since memory cell MC0 contains a logical "1" and the cell is in the conducting state, node SNS is L level and node B in latching circuit 10 continues to be held at H level; when the set signal SET returns to L level, latching circuit 10 stores a logical "1" state wherein node A=L and node B=H.

As shown in the right column in FIG. 3A, where memory cell MC0 contains a logical "0," the threshold voltage Vt thereof is positive, so although 0 V is applied to word line WL0, memory cell MC0 is off and current cannot flow therethrough so that node SNS in the page buffer is charged to H level by constant current from constant current power supply transistor P7. When an H level pulse is then provided to the set signal SET, since node SNS is H level, transistor N8 assumes the conducting state and node B in latching circuit 10 is pulled to L level; when the set signal SET returns to L level, latching circuit 10 stores a logical "0" state wherein node A=H and node B=L.

In the output portion of page buffer 100, by driving the write data load signal LD to L level and the read data output signal RD to H level, both transistors P3, N4 are placed in the conducting state and the state of the aforementioned latching circuit 10 is output over page buffer output terminal PBOUT via select gate N1 by the CMOS inverter comprising transistors P2, N5.

Program (Write)-verify operation

The Program (Write)-verify operation is now described. The Program-verify operation is shown in FIG. 3B. In programming operations, control is performed so as to shift the threshold voltage of a selected memory cell transistor to a predetermined positive programming level Vtpr. It is therefore necessary during Program-verify operations to verify that regardless of application of a predetermined positive voltage to the control gate of the selected memory cell, the memory cell will be non-conducting.

During Program-verify operations, the array Vss potential ARVss is held at 0 V while the page buffer Vss potential PBVss is held at 0 V as well; this operation is basically the same as the Read operation. A Program-verify operation differs from the Read operation in that in order to ensure Program (write) level Vtpr of the threshold voltage Vt of the memory cell, positive voltage rather than 0 V is applied to the selected word line WL. For example, application of 0.8 V to the word line WL provides a margin of about 0.8 V with respect to the minimum threshold voltage that can be read as a logical "0" at least during the Read operation. Thus, the positive voltage on the word line is set to a voltage corresponding to the programming level Vtpr.

Let it be assumed that memory cell MC0 connected to word line WL0 has been selected. At this point, 0.8 V is applied to the selected word line WL0 and about 4 V is applied to the other unselected word lines WL. About 4 V is applied to select gate lines SG1 and SG2 as well, and the string in which the selected memory cell resides is connected to the bit line BL and to the array Vss potential ARVss.

In this state, with signals BLCNTRL and BLPROT in page buffer 100 at H level, page buffer 100 and bit line BL are electrically connected. Simultaneously, with signal PBIAS at L level, p-type transistor P7 (current source) turns on and constant current is delivered to bit line BL. As in the Read operation, this current is the basis for deciding whether memory cell MC is sufficiently programmed (written). Where a memory cell is being programmed (written), up to this point, the node A and node B in latching circuit 10 in page buffer 100 have been preset to L level and H level respectively. In the absence of a programming (write) operation, the nodes A and B are preset to H level and L level respectively. Here, a programming (write) scenario is considered, so the node A and node B are assumed to be set to L level and H level respectively.

As shown in the left column in FIG. 3B, where memory cell MC0 has not been sufficiently programmed (written), the threshold voltage Vt thereof is less than the 0.8 V voltage on word line WL0 so memory cell MC0 turns on and current flows, with node SNS being drawn to L level. When an H pulse is then provided to the set signal SET, since node SNS is L level, node B in latching circuit 10 continues to be held at H level; when the set signal SET returns to L level, latching circuit 10 stores a state wherein node A=L level and node B=H level. This indicates that the Program (write)-verify has failed, whereupon the programming (write) operation is repeated.

As shown in the right column in FIG. 3B, where memory cell MC0 has been sufficiently programmed (written), the threshold voltage Vt thereof is greater than the 0.8 V voltage on selected word line WL0 so memory cell MC0 turns off and no current flows, with node SNS being charged to H level. When an H pulse is then provided to the set signal SET, since node SNS is H level, node B is drawn to L level; when the set signal SET returns to L level, latching circuit 10 in page buffer 100 is reset to a state wherein node A=H level and node B=L level. This indicates that the Program (write)-verify has succeeded, whereupon the programming (writing) operation concludes.

Erase-verify operation

The Erase-verify operation is now described. The Erase-verify operation is shown in FIG. 3C. In erase operations, threshold voltage of all memory cells of a block is shifted to negative Erase level Vtre, so during an Erase-verify operation it is necessary to apply negative voltage equivalently to the control gates of the memory cells in order to verify that all memory cells in a string are conducting.

In the present embodiment, during an Erase-verify operation, the array Vss potential ARVss (first reference potential) is held at a predetermined positive voltage VVER while the page buffer Vss potential PBVss (second reference potential) is also held at this same positive voltage VVER, as shown in FIG. 4A. Alternatively, as shown in FIG. 4B, the array Vss potential ARVss is held at a predetermined first positive voltage VVER1 while the page buffer Vss potential PBVss is held at a second positive voltage VVER2. Driving the page buffer Vss potential PBVss as well as the array Vss potential ARVss to positive voltage enables the sense operation by sense transistor N8, described later.

The Erase-verify operation is basically the same as the Read operation, but differs therefrom in that in order to ensure that the threshold voltage Vt of the selected memory cell MC0 is at negative Erase level Vter, all word lines WL of the selected block (erase unit) are driven to 0 V, and a certain positive voltage VVER is applied to the array Vss potential ARVSS. By driving the word lines WL to 0 V and applying a certain positive voltage VVER to the array Vss potential ARVSS, the control gate of the memory cell is driven to negative potential equivalently, ensuring the negative Erase threshold voltage Vtre in the memory cell. For example, with application of 0.6 V to the array Vss potential ARVSS, there is provided at least a margin of about 0.6 V with respect to the minimum threshold voltage absolute value that can be read as a logical "1" during a Read operation.

The Erase-verify operation for a selected block is now described. As shown in FIG. 3C, 0 V is applied to all word lines WL and about 4 V is applied to select gates SG1 and SG2, selecting all strings in the selected block. 0.6 V is applied to the array Vss potential ARVSS and 0.6 V is applied to the page buffer Vss potential PBVss as well. In this state, with signals BLCNTRL and BLPROT in page buffer 100 at H level, page buffer 100 and bit line BL are electrically connected.

While signal BLCNTRL is at about 1 V during Read and Program (write)-verify operations, during the Erase-verify operation it is driven to about 1.6 V (since the array Vss potential ARVSS is 0.6 V) and thus placed at a higher level of 1.0 V relative to voltage (0.6 V) on the bit line BL when memory cells are conducting. Since a string has a plurality of memory cells (16 for example) connected in series, this is done in order to deliver sufficient drain-source voltage vds to each memory cell.

Simultaneous with electrical connection of page buffer 100 to bit line BL, with signal PBIAS at L level, the constant current source p-type transistor turns on and constant current is delivered to bit line BL. This constant current is the basis for deciding whether memory cells are sufficiently erased. Up to this point, nodes A and B of latching circuit 10 in page buffer 100 have been preset to L level and H level respectively.

As shown in the left column in FIG. 3C, where a memory cell has not been sufficiently erased, the threshold voltage Vt thereof is greater than the potential difference Vgs (=−0.6) between word lines WL (0 V) and the array Vss potential ARVSS (0.6 V) (i.e., Vt>−0.6 V), so the memory cell turns off and no current flows, with node SNS in the page buffer being charged to H level. When an H pulse is then provided to the set signal SET, transistor N9 conducts, and since node SNS is H level, sense transistor N8 conducts as well and node B is drawn to L level. Thus, when the set signal SET returns to L level, latching circuit 10 resets to a state wherein node A=H level and node B=L level. This indicates that the Erase-verify has failed, whereupon the erase operation is repeated.

As shown in the right column in FIG. 3C, where on the other hand a memory cell has been sufficiently erased, the threshold voltage Vt thereof is less than the potential difference Vgs (=−0.6) between the word lines and the array Vss potential (i.e., Vt<−0.6 V), so the memory cell turns on and current flows, with node SNS being drawn to L level. It should be noted that the node SNS L level at most only drops to about the array Vss potential ARVss of 0.6 V. When an H pulse is then provided to the set signal SET, since node SNS is L level, node B in latching circuit 10 continues to be held at H level; when the set signal SET returns to L level, latching circuit 10 holds a state wherein node A=L and node B=H. This indicates that the Erase-verify has been successful, and the erase operation concludes.

At this time, although the node SNS at most only drops to about the array Vss potential ARVss (=0.6 V) with conduction by the memory cell, since the source potential of sense transistor N8 in page buffer 100 is PBVss=0.6 V, the sense transistor N8 can assume a sufficiently non-conducting state even at normal threshold voltage (0.8 V, for example), thereby preventing the inversion in error of the latching circuit seen in the conventional example. Accordingly, where the possibility exists that, from a reliability standpoint, a larger erase margin with respect to Read operations will be required, even assuming that, for example, 1 V is applied to the array Vss potential ARVSS, the source potential of sense transistor N8 is PBVss=0.6 V (or the same 1 V), whereby sense transistor N8 can safely continue to be rendered non-conducting. Where the array Vss potential ARVss is higher, in response thereto non-conducting operation of sense transistor N8 can be assured by increasing the page buffer Vss potential PBVss as well.

Figure 5A:
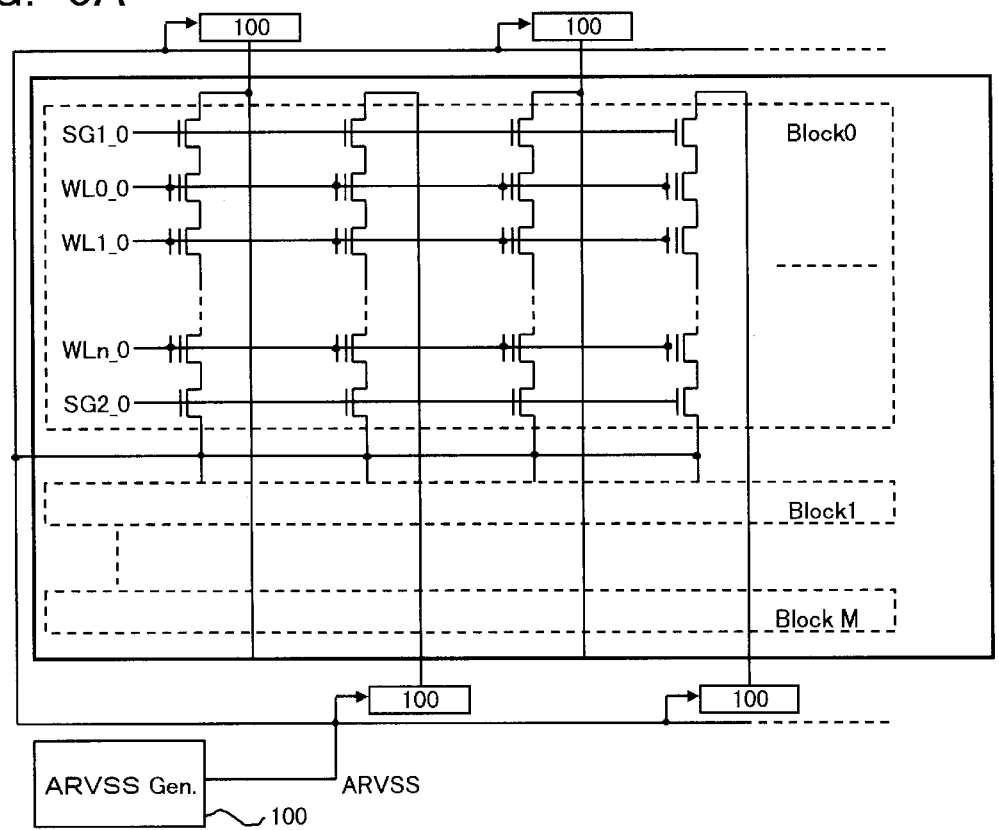
FIGS. 5A, 5B is a construction diagram of the memory cell array and page buffer in the present embodiment.

FIG. 5 is a construction diagram of the memory cell array and page buffer in the present embodiment. FIG. 5A is a construction diagram corresponding to FIG. 4A, wherein the array Vss potential ARVss and page buffer Vss potential are controlled to the same voltage. Accordingly, the voltage generated by the array Vss potential generating circuit 110 is delivered to page buffer 100 as well.

Figure 5B:
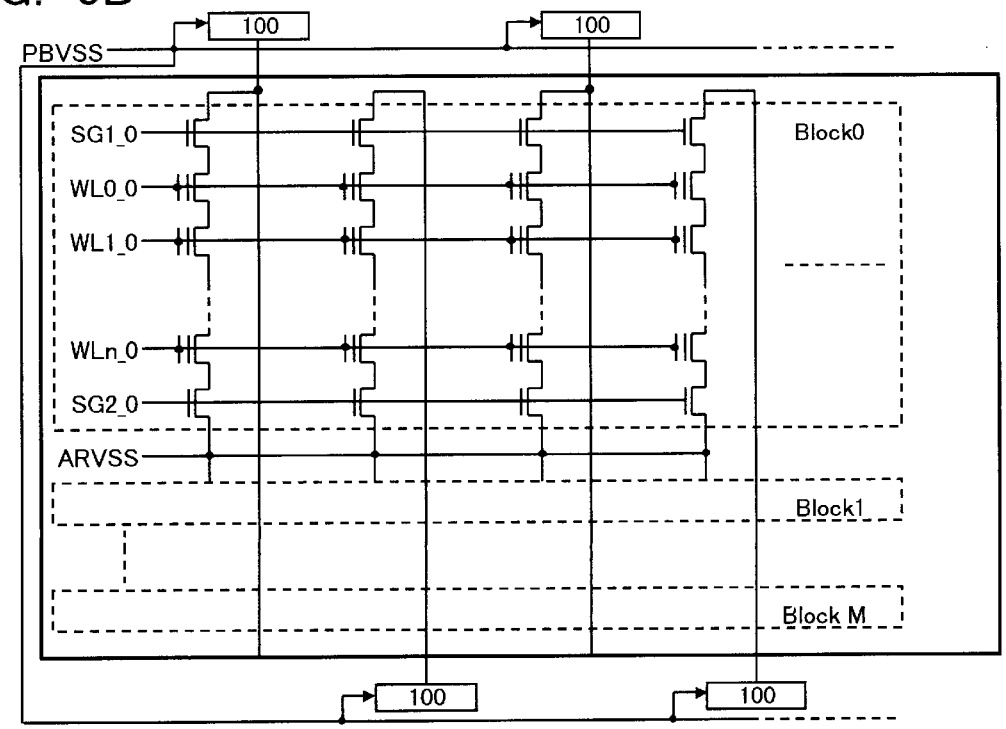

FIG. 5B is a construction diagram corresponding to FIG. 4B, wherein the array Vss potential ARVss and page buffer Vss potential PBVss are separately controlled, being controlled to different positive voltages during Erase-verify operations.

Redundant memory cell or auxiliary memory cell

The description up to this point has concerned the memory cell array and page buffer of a NAND type flash memory. There is now described an embodiment of the invention in a redundant memory cell for storing redundant information, namely, the address of a defective cell used in a NAND type flash memory. The redundant memory cell described hereinbelow may be substituted by an auxiliary memory cell for storing predetermined information other than redundant information.

Where a memory cell for storing data has become defective, the address thereof is stored as redundant information and it is replaced by another memory cell provided for this purpose. A redundant memory cell for storing the defective cell address as redundant information is therefore required. In some instances, an auxiliary memory cell used for storing various other information about the device other than redundant information may be required. In such instances, memory cell design will be analogous to the redundant memory cell.

Figure 6:
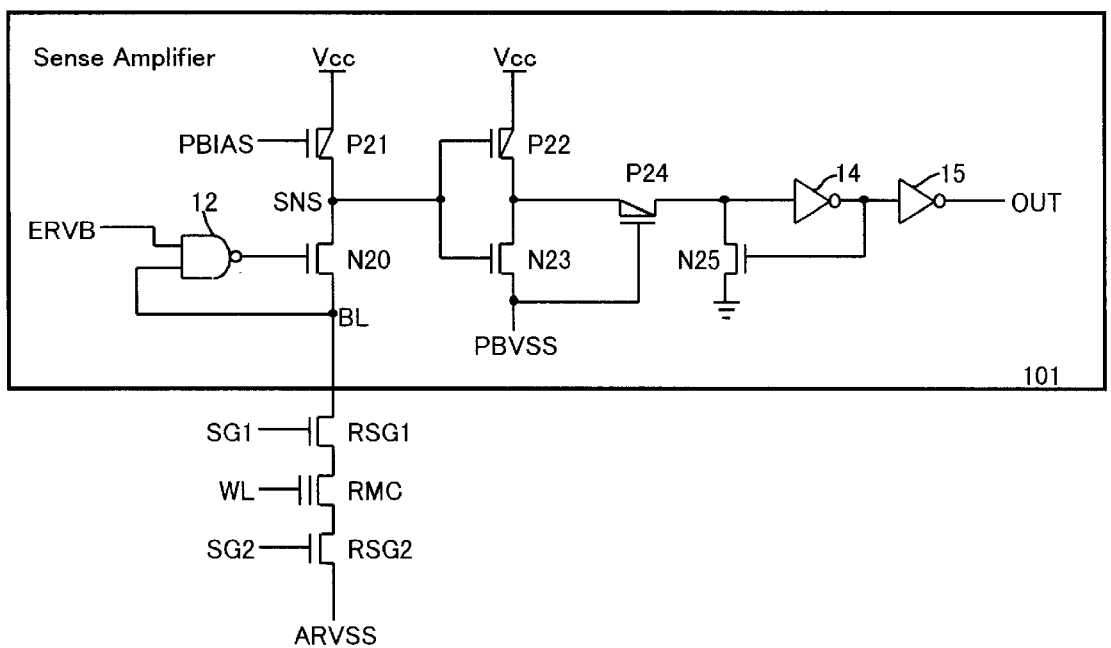
FIG. 6 is a construction diagram of the redundant memory cell in the present embodiment.
Figures 14A, 14B:
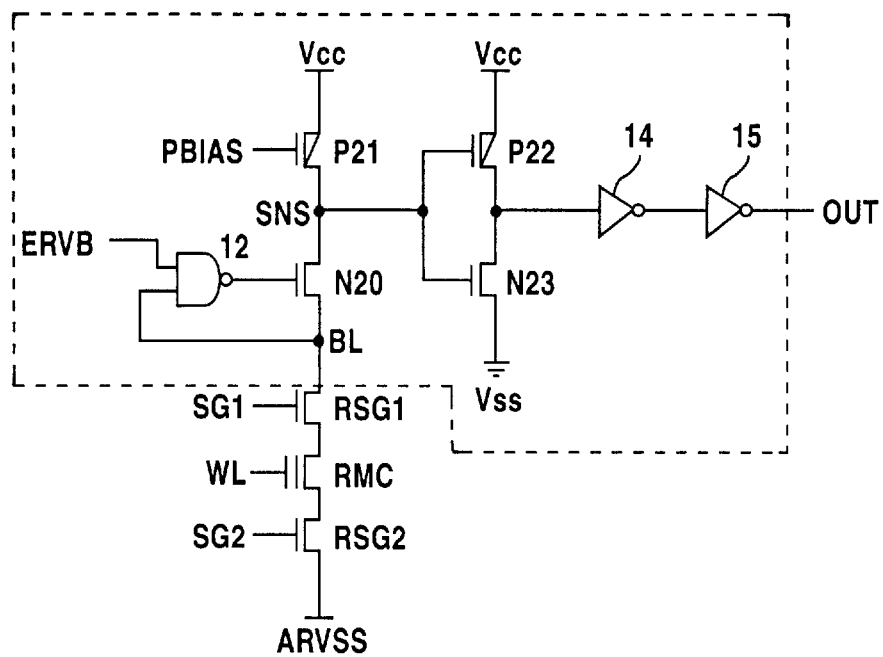
FIG. 14A is a figure showing a conventional redundant information storage circuit.
FIG. 14B is a chart showing voltages of operations.

FIG. 6 is a construction diagram of a redundant memory cell in the present embodiment. Components corresponding to those in the conventional example in FIG. 14 have been assigned the same symbols. While in FIG. 14 the source terminal of sense transistor N23 in sense amp 101 is at ground potential Vss, in the design of FIG. 6 it is at a Vss potential PBVss controlled to a predetermined positive potential during the Erase-verify operation. The sense amp Vss potential PBVss and the array Vss potential ARVss connected to the source terminal on the redundant memory cell RMC end are controlled to 0 V during Read operations and to 0 V during Program-verify operations, and during Erase-verify operations are controlled to the same predetermined positive voltage or to different positive voltages.

Figure 8B:
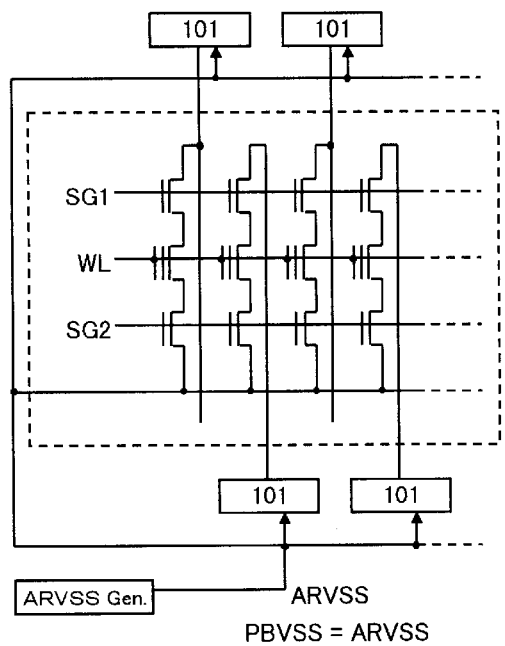
Figure 9B:
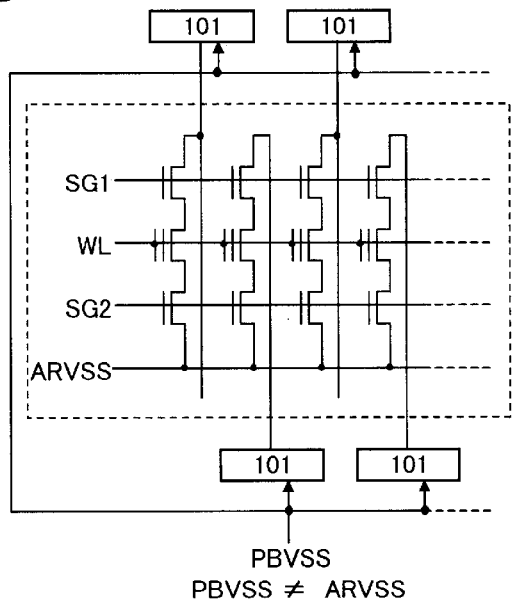

FIG. 8 depicts an example wherein the array Vss potential ARVss (first reference potential) and the sense amp Vss potential PBVss (second reference potential) are controlled to the same positive voltage VVER during Erase-verify operations. FIG. 9 depicts an example wherein these are controlled to different positive voltages VVER1 and VVER2. In the example in FIG. 8, as shown in the chart of voltage conditions of FIG. 8A, the array Vss potential ARVss and the sense amp Vss potential PBVss are controlled to the same voltage during Read operations, Program-verify operations, and Erase-verify operations, so in the construction diagram shown in FIG. 8B the output of array Vss potential generating circuit 110 is presented to the memory cells and sense amp 101.

In the example in FIG. 9, the array Vss potential ARVss and the sense amp Vss potential PBVss are controlled separately.

As regards the example of control to the same positive voltage VVER in FIG. 8, the Read operation, Program-verify operation, and Erase-verify operation are described hereinbelow with reference to the operation timing chart of FIG. 7.

Read operation

As shown in FIG. 7A, in a Read operation, with word line WL at 0 V and select gate signals SG1 and SG2 at 4 V, and with signal PBIAS at L level, p-type transistor P21 turns on and constant current is delivered to node SNS. Array Vss potential ARVSS is 0 V and sense amp Vss potential PBVss is also 0 V. An inversion erase verify signal ERVB (ERaseVerifyBar) is at power supply potential Vcc.

If memory cell RMC contains a logical "1," the threshold voltage Vt thereof is negative, so even when word line WL is 0 V, memory cell RMC draws current and as a result the potential on bit line BL goes to L level, transistor N20 assumes the conducting state, and node SNS goes to L level. Then, sense transistor N23 turns off, sense transistor P22 turns on, and H level is output over output terminal OUT via transistor P24 and inverters 14, 15.

Conversely, if memory cell RMC contains a logical "0," since the threshold voltage Vt thereof is positive, memory cell RMC turns off when word line WL is 0 V, potential on bit line BL goes to H level, transistor N20 turns off, and node SNS is charged to H level by the constant current from constant current transistor P21. Thus, since the node SNS is H level, sense transistor N23 turns on, sense transistor P21 turns off, and L level is output over output terminal OUT.

Program (write)-verify operation

The program (write)-verify operation is now described referring to FIG. 7B. The Program-verify operation is basically the same as the Read operation, but differs therefrom in that positive voltage is applied to word line WL in order to ensure a programming (write) margin. In the example described here, 0.8 V is applied to word line WL. With select gates SG1 and SG2 at 4 V and signal PBIAS as L level, p-type transistor P21 turns on and load current is delivered. Array Vss potential ARVSS is 0 V and inversion erase verify signal ERVB is H level.

Where memory cell RMC is not sufficiently programmed (written), the threshold voltage Vt thereof is less than the word line voltage of 0.8 V so memory cell RMC conducts and draws current. As a result, the node SNS goes to L level and H level is output over output terminal OUT. This indicates that Program (write)-verify has failed, whereupon the write operation is begun again.

Conversely, where memory cell RMC is sufficiently programmed (written), the threshold voltage Vt thereof is greater than the word line voltage of 0.8 V so memory cell RMC turns off, transistor N20 becomes non-conducting, and node SNS is charged to H level. As a result, L level is output over output terminal OUT. This indicates that Program (write)-verify has succeeded, and the programming (writing) operation concludes.

Erase-verify operation

The Erase-verify operation is now described referring to FIG. 7C. The Erase-verify operation is also basically the same as the Read operation, but differs therefrom in that the array Vss potential ARVSS (first reference voltage) is controlled to a predetermined positive voltage in order to ensure an erase margin. At the same time, the sense amp Vss potential PBVss (second reference voltage) is also controlled to a predetermined positive voltage to ensure on/off operation by sense transistor N23. In this example, 0.6 V is applied to the array Vss potential ARVSS and sense amp Vss potential PBVss.

First, with word line WL at 0 V and select gate lines SG1 and SG2 at 4 V, and with signal PBIAS at L level, p-type transistor P21 turns on and load current is delivered. With inversion erase verify signal ERVB at 0 V, conduction by transistor N20 is assured. As the array Vss potential ARVss is 0.6 V, even where memory cell RMC conducts and bit line BL is drawn down to ARVss, sufficient L level cannot be provided to NAND gate 12, so with inversion erase verify signal ERVB at L level the output of NAND gate 12 is reliably maintained at H level. As a result, Vcc is applied to the gate of the n-type transistor N20 connecting node SNS and bit line BL, ensuring that transistor N20 turns on.

Where memory cell RMC is not sufficiently erased, the threshold voltage Vt thereof is greater than –0.6 V (Vt>–0.6 V), memory cell RMC turns off, and the node SNS is charged to H level. Accordingly, sense transistor N23 conducts and L level is output over output terminal OUT. This indicates that the Erase-verify operation has failed, and the erase operation is begun again.

Conversely, where memory cell RMC is sufficiently erased, the threshold voltage Vt thereof is less than –0.6 V (Vt<–0.6 V), memory cell RMC draws current, and as a result, the node SNS goes to L level. It should be noted that as the array Vss potential ARVss is 0.6 V, the node SNS at most only drops to 0.6 V. However, as the source of sense transistor N23 in sense amp 101 is connected to the sense amp Vss potential (=0.6 V), gate-source voltage drops to below the threshold voltage, ensuring that sense transistor N23 is non-conducting. As a result, the output of the CMOS inverter comprising transistors P22, N23 goes to H level and H level is output over output terminal OUT. This indicates that the Erase-verify operation has succeeded and the erase operation is concluded.

As will be apparent from the preceding description, in the Erase-verify operation a certain positive voltage is applied to the array Vss potential ARVSS, whereby ideally node SNS is drawn to the L level and but not below a level equal to this potential ARVSS. The trip point (inversion input level) of the inverter comprising transistors P22 and N23 is determined by the production process and transistor capability. Typically, it is about Vcc/2 with respect to the power supply Vcc. Accordingly, where the possibility exists that, from a reliability standpoint, a larger erase margin with respect to Read operations will be required, for example, 1 V is applied to the array Vss potential ARVSS, but if power supply Vcc is low at this time (2 V, for example), Erase-verify cannot be performed. The reason is that node SNS, even under ideal conditions, drops no lower than 1 V, namely, the array Vss potential ARVSS level, and in actual practice the node SNS voltage is higher than 1 V due to the need for voltage Vds across the source and drain of the select gate transistor and memory cell. As this level (1 V) is close to the trip point (1 V) of the inverter, it is possible that the output will be intermediate level.

To solve this problem, it would be possible to manipulate the transistor ratio of the inverter to set the trip point higher. However, there are limits as to the extent to which it can be increased, with possible solutions being exhausted where higher voltages are applied to the array Vss voltage ARVSS. Breaking down the transistor ratio requires large transistor size and increased layout area. Further, the write margin changes, which may affect read speeds.

Accordingly, in the present embodiment, the source terminal PBVss of sense transistor N23 is controlled to a predetermined positive voltage during Erase-verify operations. By so doing it is possible to equivalently increase the trip points of inverters P22, N23 to whose gate the node SNS is input, enabling inverter sensing the L level of the node SNS analogous to an ordinary Read operation, notwithstanding positive voltage being applied to the array Vss potential ARVss during an Erase-verify operation.

In the example of FIG. 8, the sense amp Vss potential PBVSS and the array potential ARVSS are equal voltages; however, these need not necessarily be equal voltages, so a different positive voltage can be applied to the sense amp Vss potential PBVSS than to the array potential ARVSS, as shown in FIG. 9. While the memory described above is a circuit for storing redundant information, there is no limitation thereof to redundant information, with circuits for storing various other information for device functioning also being acceptable. The embodiment describes a single memory cell, but a plurality of cells connected in series or connected in parallel is also acceptable.

Figures 10, 11A, 11B:
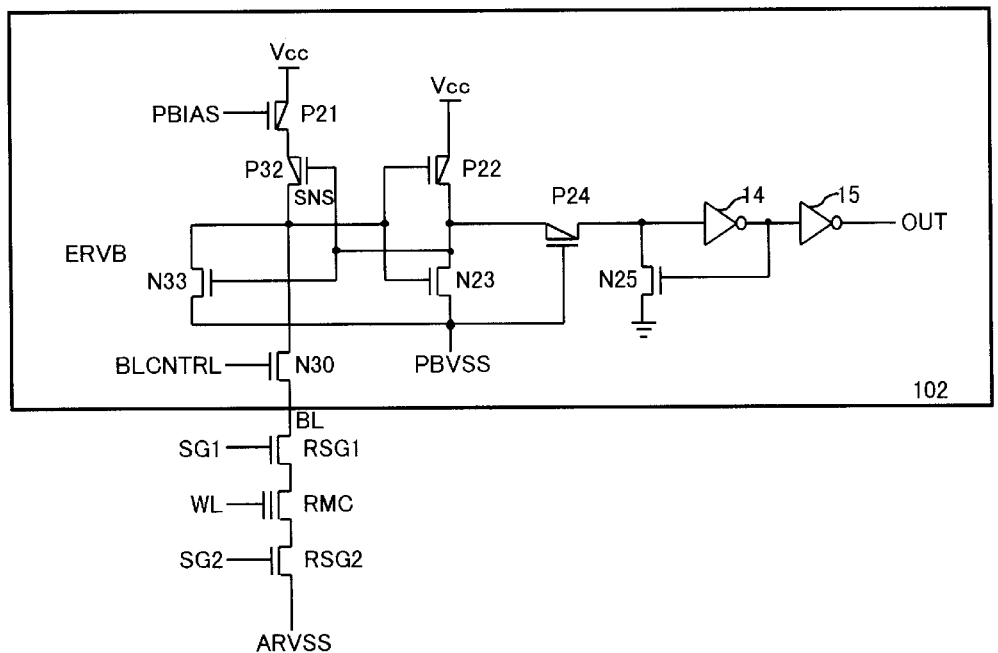
FIG. 10 is a figure showing the sense amp of another redundant memory cell.
FIGS. 11A, 11B is a chart showing voltage condition of FIG. 10.
Figure 12:
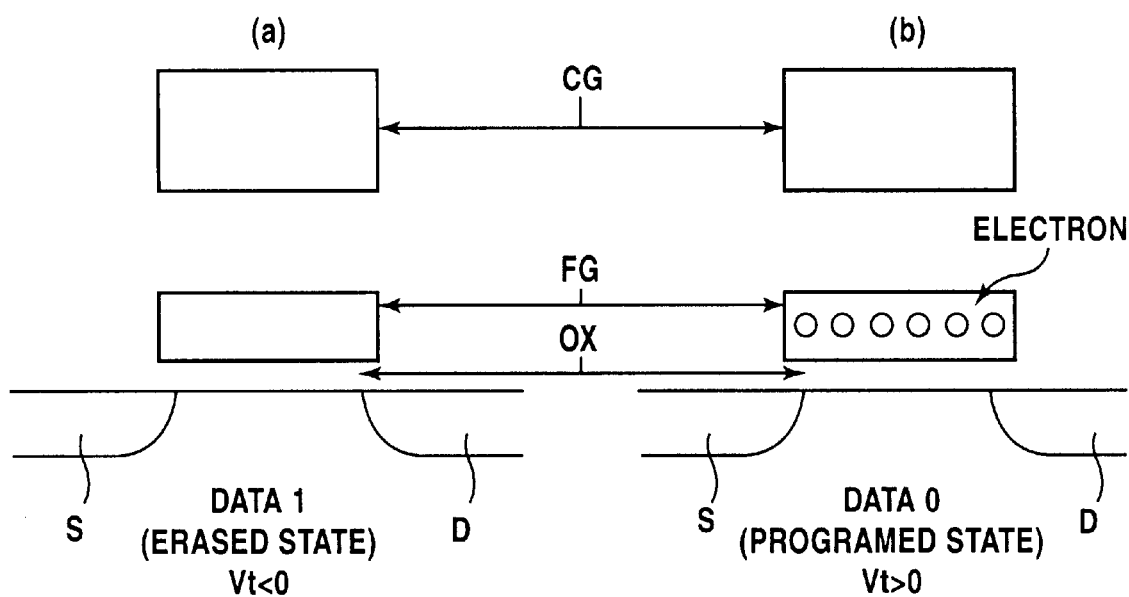
FIG. 12 is sectional view of a memory cell transistor of a typical NAND type flash memory.

FIG. 10 is a figure showing the construction of another redundant memory cell and sense amp 102. FIG. 11 is a chart showing voltage condition of FIG. 10. The circuit of FIG. 10 has the same construction as the sense amp 101 of FIG. 5 except that sense amp 102 is of latching type. Accordingly, sense amp 102 of FIG. 10 is connected to bit line BL via a transistor N30, and the level of node SNS is latched by a latching circuit comprising CMOS inverters P32, N33 and inverters P22, N23.

FIGS. 11A, 11B show voltage conditions during Read, Program (write)-verify, and Erase-verify operations. In the example of FIG. 11A, the sense amp potential PBVss and the array Vss potential ARVss are controlled to the same voltage, whereas in the example of FIG. 11B, the potentials thereof are the same (0 V) during Read and Program-verify operations but controlled to different positive voltages VVER1, VVER2 during Erase-verify operations. The embodiment describes a single memory cell, but a plurality of cells also may be connected in series. Alternatively, a plurality of cells may be connected in parallel.

In this embodiment as well, during Erase-verify operations, even if the L level of node SNS drops no lower than the array Vss potential ARVss (0.6 V, for example), the trip level (invert level) of the inverter comprising transistors P22, P23 is equivalently high due to PBVss, assuring non-conduction by transistor N23.

According to the present invention, in a NAND type nonvolatile memory wherein the erased state assumes a negative threshold voltage, verify operations may be conducted in a reliable manner during Erase-verify operations.

While the present invention has been described in reference to a specific embodiment, the scope of the invention is not limited to that embodiment and is deemed to include the scope as set out in the appended claims and their equivalents.

What is claimed is:

1. A NAND type nonvolatile memory comprising:
    cell strings in a memory array, each of the cell strings including a plurality of memory cells connected in series;
    a sense circuit having a constant current circuit connected to said memory cells, and a sense transistor for sensing potential at a connection point between said cell string and said constant current circuit;
    a first reference potential connected to an end of said cell strings on an opposite side from said connection point; and
    a second reference potential connected to the source of said sense transistor,
    wherein during erase-verify operations, said first reference potential and second reference potential are controlled to a predetermined positive potential.

2. The nonvolatile memory according to claim 1, wherein said first and second reference potentials are controlled to ground potential during normal read and program-verify operations.

3. The nonvolatile memory according to claim 1, wherein said first and second reference potentials are controlled to the same positive potential during erase-verify operation.

4. The nonvolatile memory according to claim 1, wherein said memory cells are driven to negative threshold voltage during erase operations and to positive threshold voltage during programming operations, the selected memory having 0 V applied to the control gate thereof.

5. A NAND type nonvolative memory comprising:
    an auxiliary memory cell for storing redundant information or predetermined information;
    a redundant sense circuit having a constant current circuit connected to said auxiliary memory cell, and a sense transistor for sensing potential at a connection point between said auxiliary memory cell and said constant current circuit;
    a first reference potential connected to an end of said auxiliary memory cell on an opposite said from said connection point; and
    a second reference potential connected to a source of said sense transistor,
    wherein during erase-verify operations said first reference potential and second reference potential are controlled to a predetermined positive potential.

6. The nonvolatile memory according to claim 5, wherein said first and second reference potentials are controlled to ground potential during normal read and program-verify operations of said auxiliary memory cell.

7. The nonvolatile memory according to claim 5, wherein said first and second reference potentials are controlled to the same positive potential during erase-verify operation.

8. The nonvolatile memory according to claim 5, wherein said auxiliary memory cell are driven to negative threshold voltage during erase operations and to positive threshold voltage during programming operations, the selected auxiliary memory cell having 0 V applied to the control gate thereof.

* * * * *